United States Patent
Ishishita

(10) Patent No.: US 7,495,417 B2
(45) Date of Patent: Feb. 24, 2009

(54) ACCUMULATING SYSTEM AND METHOD FOR PROCESSING ABNORMALITY OF ACCUMULATING SYSTEM

(75) Inventor: Teruo Ishishita, Nishikamo-gun (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 411 days.

(21) Appl. No.: 11/354,060

(22) Filed: Feb. 15, 2006

(65) Prior Publication Data
US 2006/0208708 A1 Sep. 21, 2006

(30) Foreign Application Priority Data
Mar. 17, 2005 (JP) .............................. 2005-076883

(51) Int. Cl.
*H02J 7/00* (2006.01)
*G01N 27/416* (2006.01)
(52) U.S. Cl. ...................... 320/134; 324/434
(58) Field of Classification Search ................ 320/134, 320/136; 324/426, 430, 433, 434

See application file for complete search history.

(56) References Cited

U.S. PATENT DOCUMENTS
6,255,803 B1 * 7/2001 Ishihara et al. .............. 320/134

FOREIGN PATENT DOCUMENTS
| EP | 1 076 242 A2 | 2/2001 |
|---|---|---|
| JP | A-05-236662 | 9/1993 |
| JP | A 9-74610 | 3/1997 |
| JP | A-09-312901 | 12/1997 |
| JP | A-10-174297 | 6/1998 |
| JP | A-2000-357541 | 12/2000 |
| JP | A 2001-116811 | 4/2001 |
| JP | A-2001-329884 | 11/2001 |

* cited by examiner

Primary Examiner—Akm E Ullah
Assistant Examiner—Ramy Ramadan
(74) Attorney, Agent, or Firm—Oliff & Berridge PLC

(57) ABSTRACT

When minor short-circuiting abnormality of a battery is determined at timing t4, a battery ECU turns on a fail-safe flag to perform a fail-safe process. In the fail-safe process, the battery ECU changes a discharging power limiting value from a first discharging power limiting value to a second discharging power limiting value that is smaller than the first discharging power limiting value as time elapses, and changes a charging power limiting value from a first charging power limiting value to a second charging power limiting value that is greater than the first charging power limiting value as time elapses.

6 Claims, 5 Drawing Sheets

| BATTERY TEMPERATURE (°C) | -30 | -20 | ... | 50 | 60 |
|---|---|---|---|---|---|
| Win TARGET VALUE | Wi1 | Wi2 | ... | Wi3 | Wi4 |
| Wout TARGET VALUE | Wo1 | Wo2 | ... | Wo3 | Wo4 |

ACCUMULATING SYSTEM AND METHOD FOR PROCESSING ABNORMALITY OF ACCUMULATING SYSTEM

This nonprovisional application is based on Japanese Patent Application No. 2005-076883 filed with the Japan Patent Office on Mar. 17, 2005, the entire contents of which are hereby incorporated by reference.

BACKGROUND OF THE INVENTION

1. Field of the Invention

The present invention relates to an accumulating system and a method for processing abnormality of an accumulating system, and particularly to a technique for controlling an accumulating system when abnormality of an accumulator battery is detected.

2. Description of the Background Art

Japanese Patent Laying-Open No. 05-236662 discloses a charging system for lead-acid batteries. This charging system measures a voltage of each block constituting the batteries. A difference in an average voltage per one cell between the blocks reaching at least a prescribed voltage is determined to be an indication of abnormality, upon which charging is stopped.

According to the charging system, upon occurrence of an abnormal cell that is involved with disconnection between the cells, internal short-circuiting and the like in each block, a block with the abnormal cell can accurately be determined to stop charging.

Japanese Patent Laying-Open No. 2000-357541 discloses a battery management device for managing the charging/discharging state of a battery as appropriate when there is a trouble in a detection system of a battery electromotive voltage. The battery management device suppresses a charging/discharging current of a battery when a trouble of a voltage detector detecting an electromotive voltage of the battery is sensed.

According to the battery management device, a fail-safe when there is a trouble with the voltage detector can be implemented.

In the charging system disclosed in Japanese Patent Laying-Open No. 05-236662, charging to the accumulator battery is stopped upon detection of an abnormal cell. Specifically, charging to the accumulator battery is stopped even in a situation of minor short-circuiting abnormality where some of the numerous cells constituting the accumulator battery are involved with short-circuiting while the accumulator battery as a whole is still capable of charging/discharging. Accordingly, the charging system greatly affects a load using the accumulator battery.

In order to address such a situation of minor short-circuiting abnormality, for example it may be possible to actuate a cooling fan of the accumulator battery and to output an alert by turning on a lamp, and not to stop charging/discharging of the accumulator battery.

However, if the accumulator battery is continued to be used in the situation of minor short-circuiting abnormality, the abnormal cell may be overheated in accordance with an increase in the internal resistance thereof, whereby the accumulator battery may be broken. In particular, a hybrid vehicle or an electric vehicle that is receiving great attention recent years frequently conducts charging/discharging of a large current in an accumulator battery incorporated as a motive power source. Therefore, if the accumulator battery is continuously used in the situation of minor short-circuiting abnormality, the abnormal cell may abruptly be overheated.

Therefore, as to a hybrid vehicle or the like, it is required not to stop charging/discharging of the accumulator battery in consideration of the effect on the system in the situation of minor short-circuiting abnormality, but still to surely prevent the accumulator battery from breaking due to an abruptly overheated cell.

Meanwhile, the battery management device disclosed in Japanese Patent Laying-Open No. 2000-357541 suppresses a charging/discharging current without stopping charging/discharging of an accumulator battery when a trouble of a voltage detector is sensed. However, upon sensing the trouble of the voltage detector, the battery management device employs a charging/discharging current control value Ic' that is suppressed as compared to a normal charging/discharging current control value Ic to exert charging/discharging control. Thus, the charging/discharging current is suppressed irrespective of the input/output state of the accumulator battery. Accordingly, the effect on a load using the accumulator battery is not always small.

SUMMARY OF THE INVENTION

The present invention has been made to solve the problems described above, and an object thereof is to provide an accumulating system that can protect an accumulator battery when abnormality of the accumulator battery is detected, with the minim effect on a load using the accumulator battery.

Another object of the present invention is to provide a method for processing abnormality of an accumulating system that can protect an accumulator battery when abnormality of the accumulator battery is detected, with the minim effect on a load using the accumulator battery.

According to the present invention, an accumulating system includes: an accumulator battery; a charging/discharging control portion controlling charging/discharging of the accumulator battery to fall within a control range defined by a prescribed limiting value; an abnormality detecting portion detecting abnormality of the accumulator battery based on a voltage of the accumulator battery; and an abnormality processing portion changing the prescribed limiting value so as to narrow the control range when the abnormality of the accumulator battery is detected by the abnormality detecting portion.

In the accumulating system according to the present invention, the charging/discharging control portion controls charging/discharging of the accumulator battery to fall within a control range defined by a prescribed limiting value. Then, the abnormality processing portion narrows the control range when the abnormality of the accumulator battery is detected by the abnormality detecting portion, and charging/discharging of the accumulator battery is limited to fall within the narrowed control range. Thus, when there is the abnormality of the accumulator battery, only when a charging/discharging quantity exceeds a range over which the accumulator battery may be broken, charging/discharging is limited to fall within the range. When charging/discharging is within the range, it is not limited.

Therefore, according to the accumulating system of the present invention, the accumulator battery can be protected when abnormality of the accumulator battery is detected, with the minimum effect on a load using the accumulator battery.

Preferably, the accumulator battery is divided into a plurality of blocks. The abnormality detecting portion detects, based on a voltage of each of the plurality of blocks, minor short-circuiting abnormality where part of a plurality of cells constituting the accumulator battery are involved with short-circuiting while the accumulator battery as a whole is still capable of charging/discharging. The abnormality processing portion changes the prescribed limiting value so as to narrow the control range when the minor short-circuiting abnormality is detected by the abnormality detecting portion.

In the accumulating system, the abnormality detecting portion detects, based on a voltage of each of the plurality of blocks, minor short-circuiting abnormality. Then, the abnormality processing portion narrows the control range when the minor short-circuiting abnormality of the accumulator battery is detected by the abnormality detecting portion, and charging/discharging of the accumulator battery is limited to fall within the narrowed control range.

Therefore, according to the accumulating system, the accumulator battery can be protected when minor short-circuiting abnormality of the accumulator battery is detected, with the minimum effect on a load using the accumulator battery.

Preferably, the abnormality processing portion changes the prescribed limiting value as time elapses when changing the prescribed limiting value.

In the accumulating system, the prescribed limiting value is changed as time elapses when changing the prescribed limiting value, and therefore an abrupt change in charging/discharging of the accumulator battery associated with a change in the limiting value is prevented. Thus, according to the accumulating system, an abrupt fluctuation in the load using the accumulator battery can be prevented.

Preferably, the abnormality processing portion determines a value to which the prescribed limiting value is to be changed in accordance with a temperature of the accumulator battery.

In the accumulating system, as a value to which the prescribed limiting value is to be changed is determined in accordance with a temperature of the accumulator battery, a range of charging/discharging can appropriately be set so that the accumulator battery is prevented from breaking. Therefore, according to the accumulating system, appropriate control in accordance with a state of the accumulator battery can be realized.

According to the present invention, a method for processing abnormality in an accumulating system includes: a first step of detecting abnormality of an accumulator battery based on a voltage of the accumulator battery; a second step of changing a prescribed limiting value defining a control range of charging/discharging of the accumulator battery so as to narrow the control range when the abnormality of the accumulator battery is detected; and a third step of controlling charging/discharging of the accumulator battery to fall within the control range changed in the second step when the abnormality of the accumulator battery is detected.

In the method for processing abnormality in an accumulating system, the control range for controlling charging/discharging of the accumulator battery is narrowed when the abnormality of the accumulator battery is detected, and charging/discharging of the accumulator battery is limited to fall within the narrowed control range. Thus, when there is the abnormality of the accumulator battery, only when a charging/discharging quantity exceeds a range over which the accumulator battery may be broken, charging/discharging is limited to fall within the range. When charging/discharging is within the range, it is not limited.

Therefore, according to the method for processing abnormality in an accumulating system of the present invention, the accumulator battery can be protected when abnormality of the accumulator battery is detected, with the minimum effect on a load using the accumulator battery.

Preferably, the accumulator battery is divided into a plurality of blocks. The first step detects, based on a voltage of each of the plurality of blocks, minor short-circuiting abnormality where part of a plurality of cells constituting the accumulator battery are involved with short-circuiting while the accumulator battery as a whole is still capable of charging/discharging. The second step changes the prescribed limiting value so as to narrow the control range when the minor short-circuiting abnormality is detected. The third step controls charging/discharging of the accumulator battery to fall within the control range changed in the second step when the minor short-circuiting abnormality of the accumulator battery is detected.

In the method for processing abnormality in an accumulating system, based on a voltage of each of the plurality of blocks, minor short-circuiting abnormality is detected. Then, the control range for controlling charging/discharging of the accumulator battery is narrowed when the minor short-circuiting abnormality of the accumulator battery is detected, and charging/discharging of the accumulator battery is limited to fall within the narrowed control range.

Therefore, according to the method for processing abnormality in an accumulating system, the accumulator battery can be protected when minor short-circuiting abnormality of the accumulator battery is detected, with the minimum effect on a load using the accumulator battery.

Preferably, the second step changes the prescribed limiting value as time elapses when changing the prescribed limiting value.

In the method for processing abnormality in an accumulating system, the prescribed limiting value is changed as time elapses when changing the prescribed limiting value, and therefore an abrupt change in charging/discharging of the accumulator battery associated with a change in the limiting value is prevented. Thus, according to the method for processing abnormality in an accumulating system, an abrupt fluctuation in a load using the accumulator battery can be prevented.

Preferably, the second step determines a value to which the prescribed limiting value is to be changed in accordance with a temperature of the accumulator battery.

In the method for processing abnormality in an accumulating system, as a value to which the prescribed limiting value is to be changed is determined in accordance with a temperature of the accumulator battery, a range of charging/discharging can appropriately be set so that the accumulator battery is prevented from breaking. Therefore, according to the method for processing abnormality in an accumulating system, appropriate control in accordance with a state of the accumulator battery can be realized.

According to the present invention, as the control range for controlling charging/discharging of the accumulating battery is narrowed when abnormality of the accumulator battery is detected, the accumulator battery can be protected with the minimum effect on a load using the accumulator battery.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
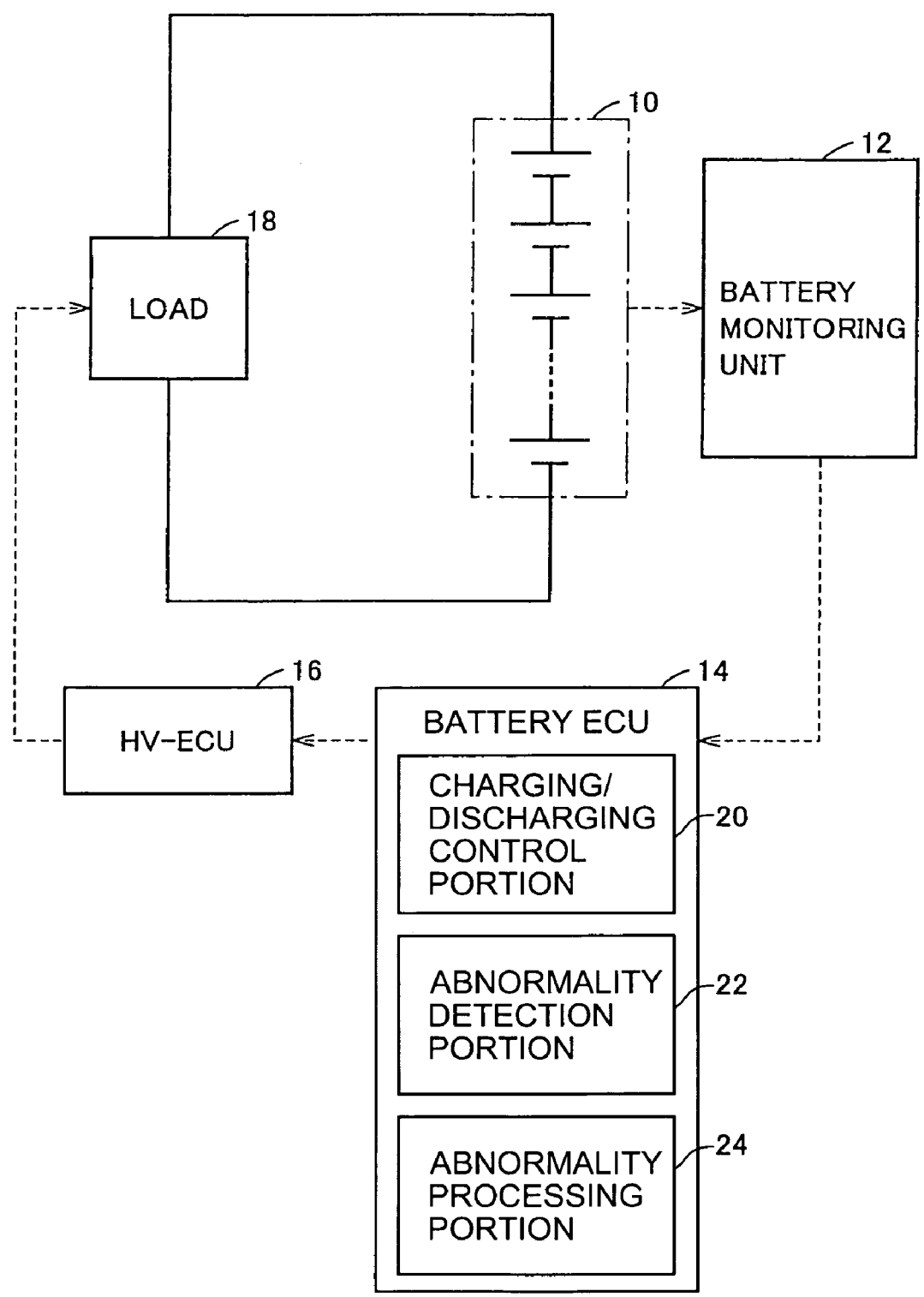
FIG. 1 is a block diagram schematically showing an overall structure of an electric system of a hybrid vehicle to which an accumulating system of an embodiment of the present invention is applied.

In the following, referring to the drawings, an embodiment of the present invention will be described in detail. In the drawings, the same or corresponding parts are denoted by an identical reference character, and description thereof is not repeated.

FIG. 1 is a block diagram schematically showing an overall structure of an electric system of a hybrid vehicle to which an accumulating system of an embodiment of the present invention is applied. Referring to FIG. 1, a hybrid vehicle 100 includes a battery 10, a battery monitoring unit 12, a battery ECU (Electronic Control Unit) 14, an HV-ECU 16, and a load 18. The ECU further includes a charging/discharging control portion 20, an abnormality detection portion 22, and an abnormality processing portion 24.

Battery 10 is a DC (Direct Current) power supply that is capable of charging/discharging, and made of a secondary battery such as a nickel-hydride metal battery or a lithium ion battery, for example. Battery 10 is formed by a plurality of blocks connected in series, each block being formed by a plurality of cells connected in series. Battery 10 outputs (discharges) the generated DC power to load 18. Battery 10 is charged by DC power output from load 18.

Battery monitoring unit 12 receives a voltage of each block of battery 10 and a voltage of overall battery 10 detected by a not-shown voltage sensor, and outputs the received voltage of each block and battery voltage to battery ECU 14. Battery monitoring unit 12 receives a current of battery 10 detected by a not-shown current sensor, and outputs the received current to battery ECU 14. Furthermore, battery monitoring unit 12 receives a temperature at a representative point of battery 10 detected by a not-shown temperature sensor, and outputs the received temperature to battery ECU 14.

Battery ECU 14 receives the voltage of each block and the battery voltage, the battery current, and the battery temperature of battery 10. Then, battery ECU 14 calculates SOC (State of Charge) of battery 10 based on each of the data, and outputs the calculated SOC to HV-ECU 16. SOC may be calculated by known schemes, such as a method employing correlation between OCV (Open Circuit Voltage) and SOC of battery 10, a method integrating a charge/discharge current quantity and the like. The charging/discharging control portion 20 controls charging/discharging of the accumulator battery to fall within a control range defined by a prescribed limiting value.

The abnormality detection portion 22 of battery ECU 14 detects cell minor short-circuiting abnormality of battery 10 based on each block voltage from battery monitoring unit 12. Specifically, the abnormality detection portion 22 of battery ECU 14 recognizes a state where a difference between each block voltage being at least a prescribed voltage (for example, at least 1.2 V) continues for a prescribed time as provisional abnormality. When the abnormality is detected again in the next system operation, battery ECU 14 confirms occurrence of cell minor short-circuiting abnormality. It is noted that the aforementioned prescribed time may be variable by a battery temperature.

When the cell minor short-circuiting abnormality is confirmed, the abnormality processing portion 24 of battery ECU 14 performs a fail-safe process, which will be described later, in order to prevent battery 10 from breaking due to an abnormal cell that is overheated in accordance with an increase in the internal resistance of the abnormal cell. Thus, battery ECU 14 determines a discharging power limiting value Wout and a charging power limiting value Win of battery 10 in the cell minor short-circuiting abnormality situation. Here, when discharging power from battery 10 is positive and charging power to battery 10 is negative, discharging power limiting value Wout corresponds to an upper limit value (positive value) of input/output power of battery 10, while charging power limiting value Win corresponds to a lower limit value (negative value) of input/output power of battery 10.

Specifically, when the cell minor short-circuiting abnormality is confirmed, battery ECU 14, and more specifically the abnormality processing portion 24 of battery ECU 14, changes an absolute value of charging power limiting value Win and discharging power limiting value Wout to smaller values than in a normal state, using a map described later. In other words, it changes discharging power limiting value Wout and charging power limiting value Win from values in a normal state so as to narrow a control range of charging/discharging of battery 10. Then, battery ECU 14 outputs the calculated discharging power limiting value Wout and charging power limiting value Win in the cell minor short-circuiting abnormality situation to HV-ECU 16.

Load 18 includes a generator coupled to an engine, a motor coupled to driving wheels, and an inverter driving the generator and the motor (all not shown). The inverter of load 18 converts DC power from battery 10 into AC power based on a control signal from HV-ECU 16 to thereby drive the motor. The inverter of load 18 converts AC power generated by the generator using the output of the engine into DC power based on a control signal from HV-ECU 16, and supplies the converted power to battery 10. Furthermore, in regenerative braking of the vehicle, the inverter of load 18 converts AC power regenerated by the motor into DC power based on a control signal from HV-ECU 16, and supplies the converted power to battery 10.

HV-ECU 16 calculates a torque command of the motor and generator of load 18 based on information such as an accelerator pedal position, a press-down amount of brake pedal, a vehicle speed and the like. Then, based on the calculated torque command, HV-ECU 16 generates a control signal for driving the inverter of load 18, and outputs the generated control signal to the inverter of load 18.

HV-ECU 16 controls load 18 based on SOC of battery 10 from battery ECU 14, so that SOC of battery 10 is around 50%, for example.

Furthermore, HV-ECU 16 controls load 18 based on discharging power limiting value Wout and charging power limiting value Win from battery ECU 14 so that discharging/charging power of battery 10 falls within a control range defined by discharging power limiting value Wout and charging power limiting value Win. Specifically, HV-ECU 16 suppresses electric power consumption of load 18 or increases electric power generation of load 18 when discharging power from battery 10 exceeds discharging power limiting value Wout. On the other hand, HV-ECU 16 suppresses electric power generation of load 18 or increases electric power consumption of load 18 when charging power to battery 10 is lower than charging power limiting value Win.

Figure 2:
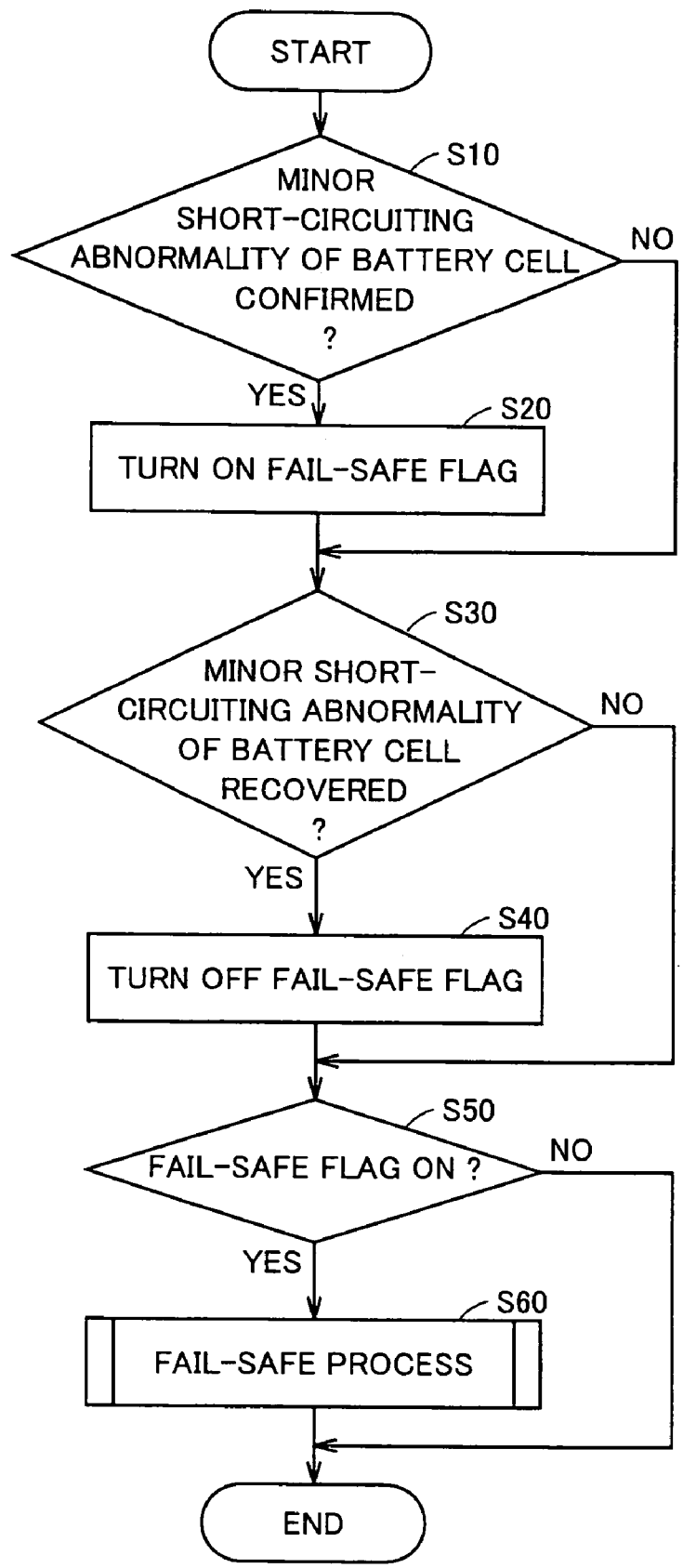
FIG. 2 is a flowchart of abnormality processing control by a battery ECU shown in FIG. 1.

FIG. 2 is a flowchart of abnormality processing control by battery ECU 14 shown in FIG. 1. The process shown by the flowchart is executed for each prescribed control cycle. Referring to FIG. 2, battery ECU 14 determines whether or not cell minor short-circuiting abnormality of battery 10 is confirmed, based on a voltage of each block and a battery temperature from battery monitoring unit 12 (step S10). Then, when battery ECU 14 determines that the cell minor short-circuiting abnormality is confirmed (YES in step S10), battery ECU 14 turns on a fail-safe flag, which is a condition for executing a fail-safe process described later (step S20). On the other hand, when the cell minor short-circuiting abnormality is not confirmed (NO in step S10), battery ECU 14 shifts the process to step S30.

Next, battery ECU 14 determines whether or not the cell minor short-circuiting abnormality of battery 10 is recovered (step S30). Then, when battery ECU 14 determines that the cell minor short-circuiting abnormality is recovered (YES in step S30), it turns off the fail-safe flag (step S40). On the other hand, when the cell minor short-circuiting abnormality is not recognized to be recovered (NO in step S30), battery ECU 14 shifts the process to step S50.

Thereafter, battery ECU 14 determines whether or not the fail-safe flag is on (step S50). If battery ECU 14 determines that the fail-safe flag is on (YES in step S50), battery ECU 14 executes the fail-safe process described later (step S60). On the other hand, if battery ECU 14 determines that the fail-safe flag is off (NO in step S50), it ends the series of processes.

Figure 3:
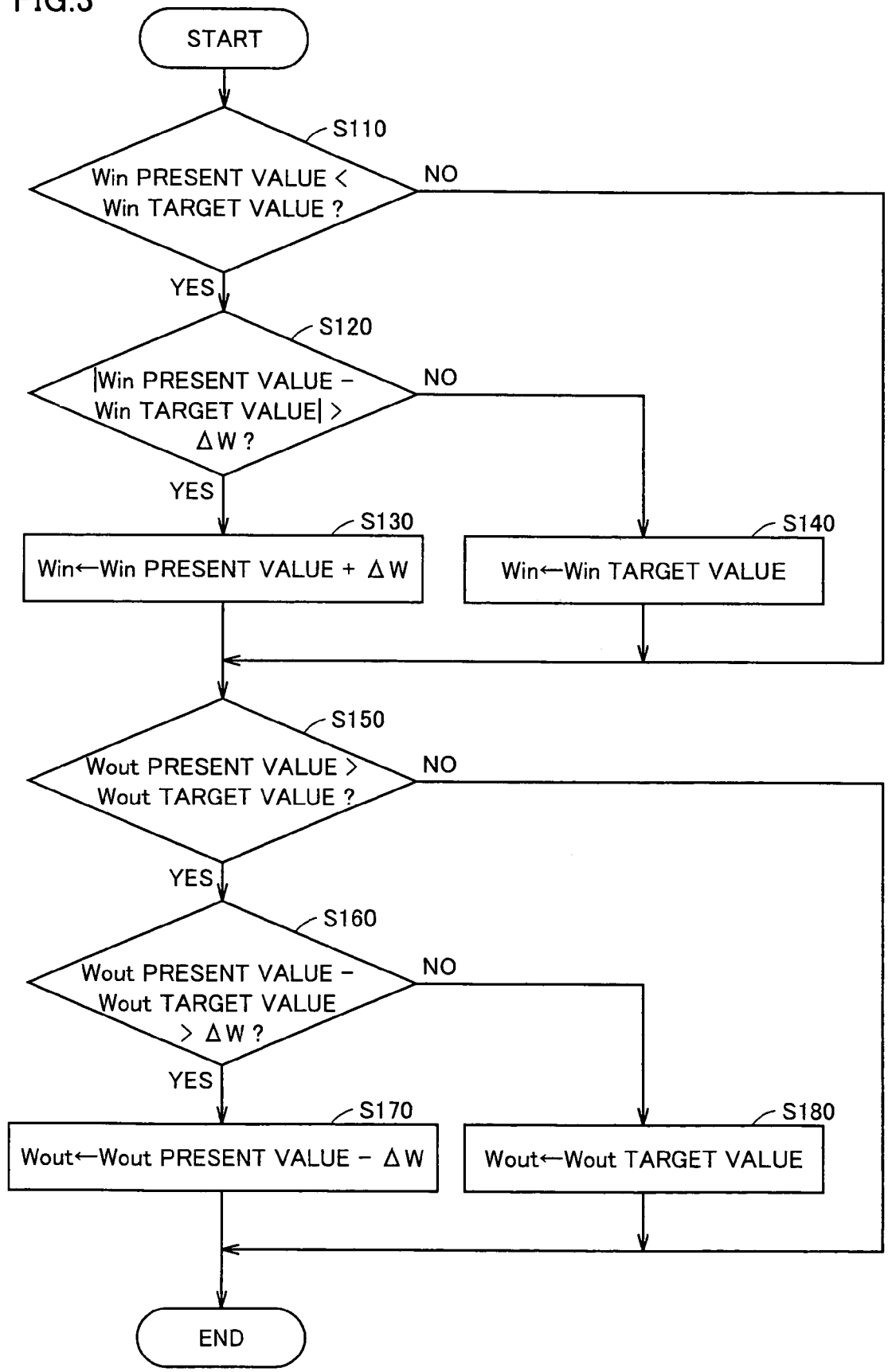
FIG. 3 is a flowchart of a fail-safe process shown in FIG. 2.

FIG. 3 is a flowchart of the fail-safe process shown in FIG. 2. Referring to FIG. 3, battery ECU 14 determines whether or not a present charging power limiting value Win (hereinafter referred to as "Win present value") is smaller than a charging power limiting value Win in a cell minor short-circuiting abnormality situation (hereinafter referred to as "Win target value") defined by a map described later (step S110). If battery ECU 14 determines that Win present value is at least Win target value (NO in step S110), then it shifts the process to step S150 as it is not necessary to change charging power limiting value Win.

On the other hand, if battery ECU 14 determines that Win present value is smaller than Win target value (YES in step S110), then it determines whether or not an absolute value of a difference between Win present value and Win target value is greater than a gradual change step quantity ΔW (step S120). If battery ECU 14 determines that the absolute value of the difference between Win present value and Win target value is greater than gradual change step quantity ΔW (YES in step S120), then it adds gradual change step quantity ΔW to Win present value to be charging power limiting value Win (step S130). On the other hand, battery ECU 14 determines that the absolute value of the difference between Win present value and Win target value is at most gradual change step quantity ΔW (NO in step S120), then it employs Win target value as charging power limiting value Win (step S140).

Thus, when changing charging power limiting value Win from Win present value to Win target value, battery ECU 14 limits a change quantity in one control cycle up to gradual change step quantity ΔW. In other words, when changing charging power limiting value Win from Win present value to Win target value, battery ECU 14 changes charging power limiting value Win in a step-wise manner (as time elapses). Thus, an abrupt change in the charging quantity of battery 10 is prevented, and abrupt effect on load 18 is prevented.

Next, battery ECU 14 determines whether or not a present discharging power limit value Wout (hereinafter referred to as "Wout present value") is greater than a discharging power limiting value Wout in a cell minor short-circuiting abnormality situation (hereinafter referred to as "Wout target value") defined by a map described later (step S150). If battery ECU 14 determines that Wout present value is at most Wout target value (NO in step S150), then it ends the series of processes as it is not necessary to change discharging power limiting value Wout.

On the other hand, if battery ECU 14 determines that Wout present value is greater than Wout target value (YES in step S150), it determines whether or not a difference between Wout present value and Wout target value is greater than gradual change step quantity ΔW (step S160). If battery ECU 14 determines that the difference between Wout present value and Wout target value is greater than gradual change step quantity ΔW (YES in step S160), then it subtracts gradual change step quantity ΔW from Wout present value to be discharging power limiting value Wout (step S170). On the other hand, if battery ECU 14 determines that the difference between Wout present value and Wout target value is at most gradual change step quantity ΔW (NO in step S160), then it employs Wout target value as discharging power limiting value Wout (step S180).

Thus, when changing discharging power limiting value Wout from Wout present value to Wout target value, similarly to the process for charging power limiting value Win, battery ECU 14 limits a change quantity in one control cycle up to gradual change step quantity ΔW. In other words, when changing discharging power limiting value Wout from Wout present value to Wout target value, battery ECU 14 changes discharging power limiting value Wout in a step-wise manner (as time elapses). Thus, an abrupt change in the discharging quantity of battery 10 is prevented, and abrupt effect on load 18 is prevented.

Figures 4, 5:
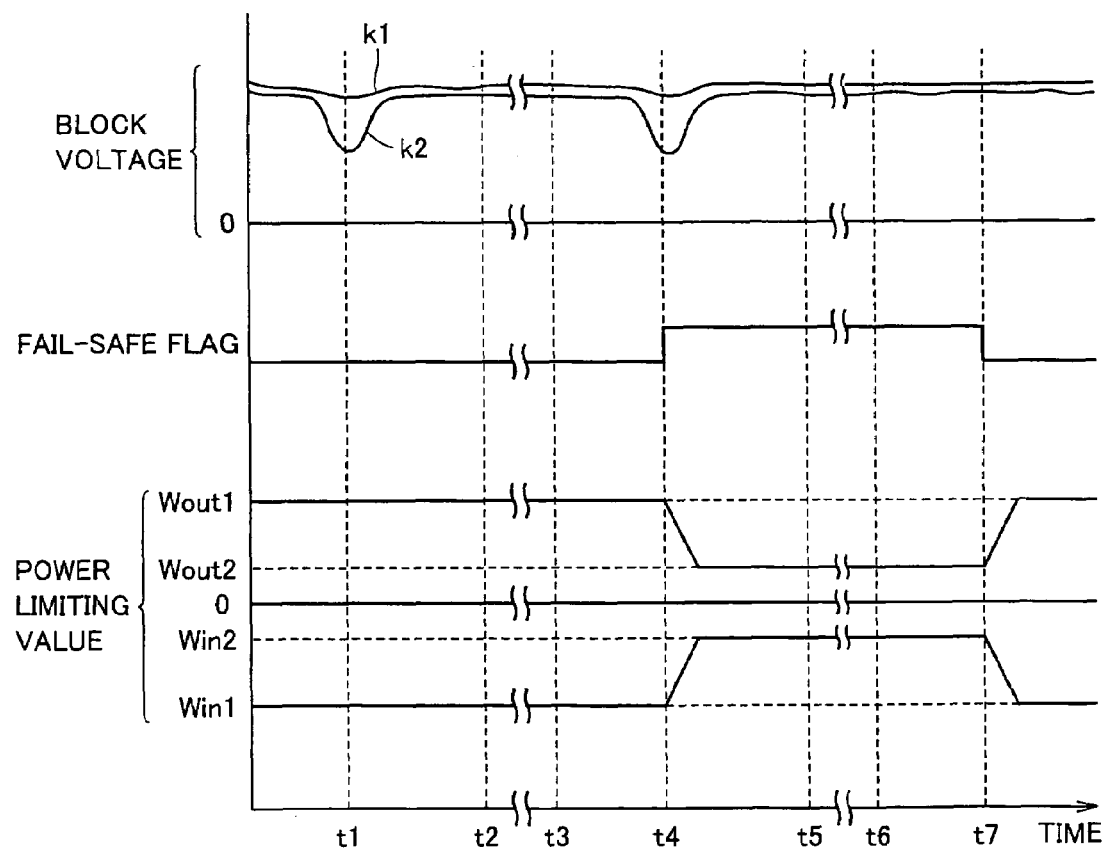
FIG. 4 is a map for determining a charging power limiting value and a discharging power limiting value of a battery in a situation of cell minor short-circuiting abnormality.
FIG. 5 is a timing chart for describing abnormality processing control by the battery ECU shown in FIG. 1.

FIG. 4 is a map for determining charging power limiting value Win and discharging power limiting value Wout of battery 10 in a cell minor short-circuiting abnormality situation. Referring to FIG. 4, charging power limiting value Win (Win present value) and discharging power limiting value Wout (Wout target value) in a cell minor short-circuiting abnormality situation are different depending on a battery temperature of battery 10 from battery monitoring unit 12. While Win target value and Wout target value are set to values that can prevent battery 10 from breaking in a minor short-circuiting abnormality situation of battery 10, the internal resistance or the heat releasing efficiency of battery 10 changes depending on a battery temperature. Accordingly, it is intended here to appropriately set Win target value and Wout target value in accordance with a battery temperature.

FIG. 5 is a timing chart for describing the abnormality processing control by the battery ECU 14 shown in FIG. 1. Referring to FIG. 5, at timing t1, a block voltage of battery 10 indicated by k2 drops, whereby a difference between thereof and a block voltage indicated by k1 becomes at least a prescribed voltage. Thus, cell minor short-circuiting abnormality of battery 10 is detected. It is noted that the cell minor short-circuiting abnormality is recognized as provisional abnormality at this time point, and not confirmed.

At timing t2, the ignition key is turned off to stop the system. Next, at timing t3, the ignition key is turned on to actuate the system. Then, while the system is operating, the block voltage indicated by k2 again drops at timing t4, whereby cell minor short-circuiting abnormality of battery 10 is detected. Then, the cell minor short-circuiting abnormality is confirmed, and battery ECU 14 turns on the fail-safe flag to execute the aforementioned fail-safe process.

Thus, discharging power limiting value Wout changes as time elapses (in a step-wise manner) from present value Wout 1 to target value Wout2 in a cell minor short-circuiting abnormality situation, and charging power limiting value Win changes as time elapses (in a step-wise manner) from present value Win1 to target value Win2 in a cell minor short-circuiting abnormality situation, whereby charging/discharging of battery 10 is limited.

Thereafter, the ignition key is turned off at timing t5, and the ignition key is turned on at timing t6. At this time point, since the cell minor short-circuiting abnormality is not recognized to be recovered, the fail-safe flag is on, and the fail-safe process is executed.

At timing t7, when the cell minor short-circuiting abnormality is recognized to be recovered, discharging power limiting value Wout changes as time elapses (in a step-wise manner) from Wout2 to Wout1, and charging power limiting value Win changes as time elapses (in a step-wise manner) from Win2 to Win1, whereby the limit on charging/discharging of battery 10 is released.

Figure 6:
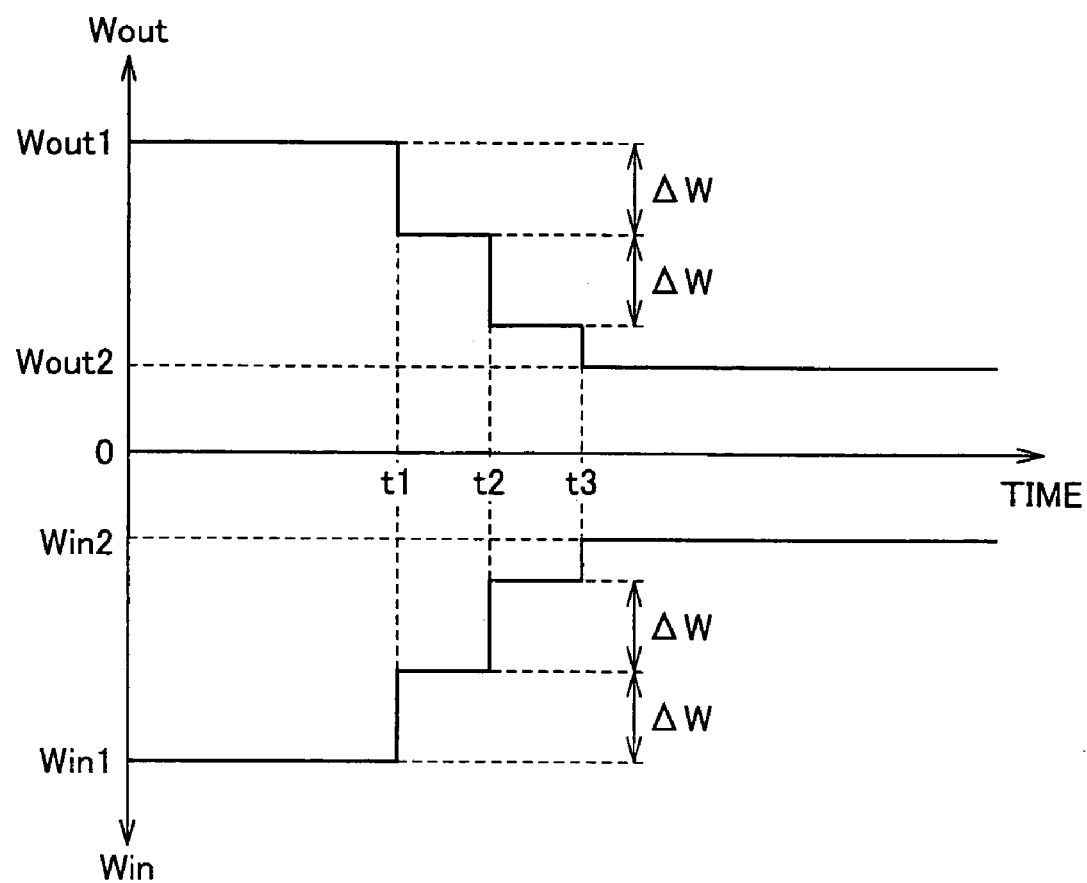
FIG. 6 shows in detail changes in the charging power limiting value and the discharging power liming value in the fail-safe process shown in FIG. 3.

FIG. 6 shows in detail changes in discharging power limiting value Wout and charging power limiting value Win in the fail-safe process shown in FIG. 3. Referring to FIG. 6, at timing t1, the cell minor short-circuiting abnormality is confirmed, and the fail-safe flag is turned on. As the difference between present value Wout1 and target value Wout2 in a cell minor short-circuiting abnormality situation of discharging power limiting value Wout is greater than gradual change step quantity ΔW, discharging power limiting value Wout changes from present value Wout1 by ΔW. At timing t2 that is one control cycle after timing t1, the difference between the value of discharging power limiting value Wout and target value Wout2 in the cell minor short-circuiting abnormality situation is still greater than gradual change step quantity ΔW, and therefore discharging power limiting value Wout further changes from that value by ΔW. Then, at timing t3 that is one control cycle after timing t2, discharging power control value Wout attains target value Wout2.

It is noted that charging power limiting value Win similarly changes in a step-wise manner from timing t1 to timing t3, from present value Win1 to target value Win2 by gradual change step quantity ΔW.

As above, according to the present embodiment, as discharging power limiting value Wout and charging power limiting value Win are changed when minor short-circuiting abnormality of battery 10 is confirmed so as to limit charging/discharging of battery 10, battery 10 can be protected. As charging/discharging is not limited when charging/discharging of battery 10 is within a range of discharging power limiting value Wout and charging power limiting value Win, an effect on load 18 is minimized.

Further, as discharging power limiting value Wout and charging power limiting value Win are changed as time elapses (in a step-wise manner) when these values are changed, an abrupt change in charging/discharging of battery 10 associated with changes in discharging power limiting value Wout and charging power limiting value Win is prevented. Accordingly, an abrupt effect on load 18 is prevented.

Still further, as Win target value and Wout target value in a minor short-circuiting abnormality situation of battery 10 can be set to different values depending on a battery temperature, an appropriate fail-safe process corresponding to the state of battery 10 can be realized.

Although in the above-described embodiment the accumulating system has been described to be applied to a hybrid vehicle, the application range of the present invention is not limited to the accumulating system applied to the hybrid vehicle, and the invention may be applied to an electric vehicle and other systems.

In the above description, battery 10 corresponds to "an accumulator battery" in the present invention, while HV-ECU 16 and load 18 correspond to "a charging/discharging control portion" in the present invention. Step S10 executed by battery ECU 14 corresponds to a process executed by "an abnormality detecting portion" in the present invention, the fail-safe process executed by battery ECU 14 corresponds to a process executed by "an abnormality processing portion" in the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An accumulating system, comprising:
   an accumulator battery;
   a charging/discharging control portion controlling charging/discharging of said accumulator battery to fall within a control range defined by a prescribed limiting value;
   an abnormality detecting portion detecting an abnormality of said accumulator battery based on a voltage of said accumulator battery; and
   an abnormality processing portion changing said prescribed limiting value so as to narrow said control range when the abnormality of said accumulator battery is detected by said abnormality detecting portion, wherein
   in changing said prescribed limiting value, said abnormality processing portion determines a target value of said prescribed limiting value in accordance with a temperature of said accumulator battery and calculates an absolute value of difference between a current value of said prescribed limiting value and said target value, and
   when said absolute value is greater than a prescribed value limiting a change amount per one control cycle in changing said prescribed limiting value from said current value to said target value, said abnormality processing portion limits said change amount per one control cycle to said prescribed value, thereby changing said prescribed limiting value stepwise from said current value to said target value.

2. The accumulating system according to claim 1, wherein said accumulator battery is divided into a plurality of blocks,
   said abnormality detecting portion detects, based on a voltage of each of said plurality of blocks, minor short-circuiting abnormality where part of a plurality of cells constituting said accumulator battery are involved with short-circuiting while said accumulator battery as a whole is still capable of charging/discharging, and
   said abnormality processing portion changes said prescribed limiting value so as to narrow said control range when said minor short-circuiting abnormality is detected by said abnormality detecting portion.

3. An accumulating system, comprising:
   an accumulator battery;
   charging/discharging control means for controlling charging/discharging of said accumulator battery to fall within a control range defined by a prescribed limiting value;
   abnormality detecting means for detecting an abnormality of said accumulator battery based on a voltage of said accumulator battery; and
   abnormality processing means for changing said prescribed limiting value so as to narrow said control range when the abnormality of said accumulator battery is detected by said abnormality detecting means, wherein in changing said prescribed limiting value, said abnormality processing means determines a target value of said prescribed limiting value in accordance with a temperature of said accumulator battery and calculates an absolute value of difference between a current value of said prescribed limiting value and said target value, and when said absolute value is greater than a prescribed value limiting a change amount per one control cycle in changing said prescribed limiting value from said current value to said target value, said abnormality processing means limits said change amount per one control cycle to said prescribed value, thereby changing said prescribed limiting value stepwise from said current value to said target value.

4. The accumulating system according to claim 3, wherein said accumulator battery is divided into a plurality of blocks, said abnormality detecting means detects, based on a voltage of each of said plurality of blocks, minor short-circuiting abnormality where part of a plurality of cells constituting said accumulator battery are involved with short-circuiting while said accumulator battery as a whole is still capable of charging/discharging, and said abnormality processing means changes said prescribed limiting value so as to narrow said control range when said minor short-circuiting abnormality is detected by said abnormality detecting means.

5. A method for processing abnormality in an accumulating system, comprising:

a first step of detecting an abnormality of an accumulator battery based on a voltage of said accumulator battery;

a second step of changing a prescribed limiting value defining a control range of charging/discharging of said accumulator battery so as to narrow said control range when the abnormality of said accumulator battery is detected; and a third step of controlling charging/discharging of said accumulator battery to fall within the control range changed in said second step when the abnormality of said accumulator battery is detected, wherein said second step includes:

a sub-step of determining a target value of said prescribed limiting value in accordance with a temperature of said accumulator battery and calculating an absolute value of difference between a current value of said prescribed limiting value and said target value;

a sub-step of determining whether or not said absolute value is greater than a prescribed value limiting a change amount per one control cycle in changing said prescribed limiting value form said current value to said target value; and a sub-step of limiting, when it is determined that said absolute value is greater than said prescribed value, said change amount per one control cycle to said prescribed value, thereby changing said prescribed limiting value stepwise from said current value to said target value.

6. The method for processing abnormality in an accumulating system according to claim 5, wherein said accumulator battery is divided into a plurality of blocks, said first step detects, based on a voltage of each of said plurality of blocks, minor short-circuiting abnormality where part of a plurality of cells constituting said accumulator battery are involved with short-circuiting while said accumulator battery as a whole is still capable of charging/discharging, said second step changes said prescribed limiting value so as to narrow said control range when said minor short-circuiting abnormality is detected, and said third step controls charging/discharging of said accumulator battery to fall within the control range changed in said second step when said minor short-circuiting abnormality of said accumulator battery is detected.

* * * * *